United States Patent
Heo et al.

(10) Patent No.: US 9,564,924 B2
(45) Date of Patent: Feb. 7, 2017

(54) APPARATUS AND METHOD FOR DESIGNING QUANTUM CODE

(75) Inventors: Jun Heo, Seoul (KR); Jeong Hwan Shin, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 24 days.

(21) Appl. No.: 14/377,781

(22) PCT Filed: Feb. 21, 2012

(86) PCT No.: PCT/KR2012/001291
§ 371 (c)(1),
(2), (4) Date: Aug. 22, 2014

(87) PCT Pub. No.: WO2013/118931
PCT Pub. Date: Aug. 15, 2013

(65) Prior Publication Data
US 2015/0019930 A1   Jan. 15, 2015

(30) Foreign Application Priority Data
Feb. 8, 2012 (KR) .......................... 10-2012-0012746

(51) Int. Cl.
*H03M 13/11* (2006.01)
*H03M 13/13* (2006.01)
(Continued)

(52) U.S. Cl.
CPC ........... *H03M 13/13* (2013.01); *H03M 13/033* (2013.01); *H03M 13/05* (2013.01); *H03M 13/21* (2013.01); *H03M 13/615* (2013.01)

(58) Field of Classification Search
CPC ..................................................... H03M 13/11
(Continued)

(56) References Cited

U.S. PATENT DOCUMENTS 6,128,764 A * 10/2000 Gottesman ........... G06N 99/002
714/785
7,496,203 B2   2/2009 Choi et al.
(Continued)

FOREIGN PATENT DOCUMENTS

JP   2005-269105   9/2005

OTHER PUBLICATIONS

Chuang, Isaac L., et al., "Codeword Stabilized Quantum Codes: Algorithm & Structure," J. Math. Phys., Apr. 2009, vol. 50, Issue 4, pp. 1-11.

*Primary Examiner* — Fritz Alphonse
(74) *Attorney, Agent, or Firm* — Duane Morris LLP; J. Rodman Steele, Jr.; Gregory M. Lefkowitz

(57) ABSTRACT

Provided is an apparatus for designing a quantum code, which includes an analyzing unit for analyzing at least one quantum error generated in a quantum error channel as at least one binary error by using a standard form codeword stabilized quantum (CWS) code, a code generating unit for generating a binary error-correcting code which corrects the at least one binary error, a word operator generating unit for generating at least one word operator of the CWS code by using the at least one binary error-correcting code, and a codeword generating unit for generating at least one codeword including at least one entangled qubit (ebit) by using the at least one word operator.

19 Claims, 2 Drawing Sheets

(51) Int. Cl.
*H03M 13/03* (2006.01)
*H03M 13/05* (2006.01)
*H03M 13/00* (2006.01)
*H03M 13/21* (2006.01)

(58) Field of Classification Search
USPC .................................................. 714/746, 785
See application file for complete search history.

(56) References Cited

U.S. PATENT DOCUMENTS

| | | | |
|---|---|---|---|
| 7,505,881 B2 * | 3/2009 | Dangui | .................. B82Y 20/00 |
| | | | 703/2 |
| 2004/0044940 A1 * | 3/2004 | Lawrence | ............ G06N 99/002 |
| | | | 714/746 |
| 2005/0157875 A1 | 7/2005 | Nishioka et al. | |
| 2008/0144833 A1 * | 6/2008 | Matsumoto | ........ H03M 13/1102 |
| | | | 380/278 |
| 2011/0222848 A1 | 9/2011 | Lukin et al. | |

* cited by examiner

APPARATUS AND METHOD FOR DESIGNING QUANTUM CODE

TECHNICAL FIELD

Embodiments of the present disclosure relates to a codeword stabilizing apparatus and method using an entangled qubit for designing a quantum code.

BACKGROUND ART

Most techniques in relation to a quantum error-correcting code, which are in progress, tend to make a new quantum error-correcting code by applying an existing error-correcting code designing technique.

Quantum error-correcting codes may be generally classified into linear codes and nonlinear codes depending on their configuring manners.

Among nonlinear codes, a stabilizer code proposes a method for easily configuring a quantum error-correcting code which satisfies a dual-containing condition in an existing linear block code, and most quantum error-correcting code techniques are being developed based on the stabilizer code.

Recently, a codeword stabilized quantum (CWS) code capable of describing both linear code and nonlinear code has been proposed as a more generalized code designing technique.

The CWS code may propose a technique capable of designing a quantum error-correcting code by using an existing error-correcting code.

In the quantum error-correcting code, a linear code allows easy configuring and expanding but may be inferior to the maximum performance of a code which may be obtained from a nonlinear code, and a nonlinear code is capable of exhibiting better performance in comparison to a linear code but is not yet being developed diversely since it is not easily configured.

Since it is difficult to configure a nonlinear quantum code, various nonlinear quantum error-correcting codes have not yet been developed, and an error correctable by nonlinear codes which have been developed based on a circular graph until now, including CWS codes, is limited to a single error.

Recently, a technique for designing entanglement-assisted quantum error-correcting codes (EAQECCs) has been proposed. The EAQECCs technique may propose a method for designing a quantum error-correcting code from existing linear block codes without a dual-containing condition of a stabilizer code by applying an entangled qubit (ebit) to the stabilizer code.

Recent study on the EAQECCs shows that the performance of a stabilizer code can be improved by using ebit.

DISCLOSURE

Technical Problem

The present disclosure is directed to improving the performance of a quantum error-correcting code by designing the quantum error-correcting code so that an entangled qubit is applied to a CWS code designing technique.

The present disclosure is also directed to providing an apparatus and method for designing a nonlinear quantum error-correcting code, which may correct two or more errors.

Technical Solution

In one general aspect, the present disclosure provides an apparatus for designing a quantum code, which includes: an analyzing unit for analyzing at least one quantum error generated in a quantum error channel as at least one binary error by using a standard form codeword stabilized quantum (CWS) code; a code generating unit for generating a binary error-correcting code which corrects the at least one binary error; a word operator generating unit for generating at least one word operator of the CWS code by using the at least one binary error-correcting code; and a codeword generating unit for generating at least one codeword including at least one entangled qubit (ebit) by using the at least one word operator.

In an embodiment of the present disclosure, a transmitting unit and a receiving unit may share the at least one entangled qubit.

In an embodiment of the present disclosure, the at least one word operator may be generated independently in a transmitting unit.

The quantum code designing apparatus according to an embodiment of the present disclosure may further include an initializing unit for making the at least one quantum error into an initial state by applying the at least one entangled qubit to an initial state of qubit.

The quantum code designing apparatus according to an embodiment of the present disclosure may further include a coding unit for coding the initial state by using a unitory coding operation which generates a stabilizer generator of a standard form of the CWS code.

The quantum code designing apparatus according to an embodiment of the present disclosure may further include an eliminating unit for eliminating an entangled qubit performed at a receiving unit from the at least one word operator by applying the stabilizer generator to the at least one word operator.

In an embodiment of the present disclosure, the word operator generating unit may generate a word operator for the initial state by applying a unitory coding operation to the word operator, from which an entangled qubit is eliminated, performed at the receiving unit.

In another general aspect, the present disclosure provides a method for designing a quantum code, which includes: analyzing at least one quantum error generated in a quantum error channel as at least one binary error by using a standard form codeword stabilized quantum (CWS) code; generating a binary error-correcting code which corrects the at least one binary error; generating at least one word operator of the CWS code by using the at least one binary error-correcting code; and generating at least one codeword including at least one entangled qubit (ebit) by using the at least one word operator.

Advantageous Effects

According to an embodiment of the present disclosure, the performance of a quantum error-correcting code may be improved by designing the quantum error-correcting code so that an entangled qubit is applied to a CWS code designing technique.

According to an embodiment of the present disclosure, an apparatus and method for designing a nonlinear quantum error-correcting code, which may correct two or more errors, may be provided.

BEST MODE

Hereinafter, the embodiments of the present disclosure will be described in detail with reference to accompanying drawings, but the present disclosure is not limited to or restricted by the embodiments.

Meanwhile, if it is judged that explanation about any function or configuration known in the art may unnecessarily make the essence of the present disclosure vague, its detailed description will be omitted. In addition, terminologies used in the specification are selected to suitably express embodiments of the present disclosure, which may be changed according to users, the intension of operators, or customs in the related art. Therefore, the terminologies should be defined based on the overall contents of the specification.

A quantum code designing apparatus according to an embodiment of the present disclosure provides a method for designing a quantum error-correcting code by applying an entangled qubit to a CWS code designing technique.

The quantum code designing apparatus according to an embodiment of the present disclosure may be configured so that information transmitting/receiving units may share an entangled qubit, and a codeword containing the entangled qubit may be independently coded just by a transmitting unit by means of the CWS code designing technique.

The quantum code designing apparatus according to an embodiment of the present disclosure may design a nonlinear quantum error-correcting code capable of correcting two or more errors by applying the above technique.

Figure 1:
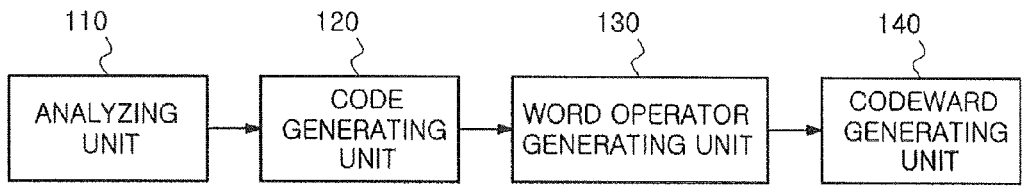
FIG. 1 is a block diagram showing a quantum code designing apparatus according to an embodiment of the present disclosure.

FIG. 1 is a block diagram showing a quantum code designing apparatus according to an embodiment of the present disclosure.

The quantum code designing apparatus according to an embodiment of the present disclosure includes an analyzing unit 110 for analyzing at least one quantum error generated in a quantum error channel as at least one binary error by using a standard form codeword stabilized quantum (CWS) code, a code generating unit 120 for generating a binary error-correcting code which corrects the at least one binary error, a word operator generating unit 130 for generating at least one word operator of the CWS code by using the at least one binary error-correcting code, and a codeword generating unit 140 for generating at least one codeword including at least one entangled qubit (ebit) by using the at least one word operator.

In an embodiment of the present disclosure, a transmitting unit and a receiving unit may share the at least one entangled qubit.

In an embodiment of the present disclosure, the at least one word operator may be generated independently at the transmitting unit.

Hereinafter, a method for designing a quantum code will be described based on the detailed configuration of the quantum code designing apparatus according to an embodiment of the present disclosure.

Figure 2:
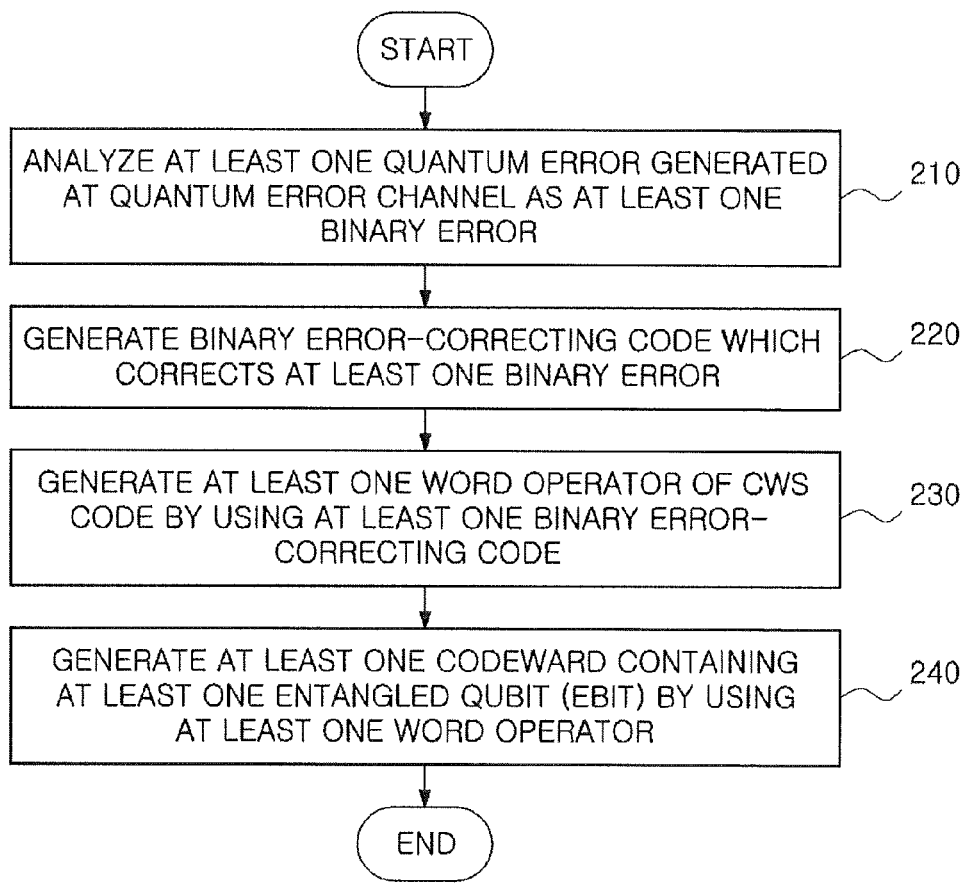
FIG. 2 is a flowchart for illustrating a quantum code designing method according to an embodiment of the present disclosure.
Figure 3:
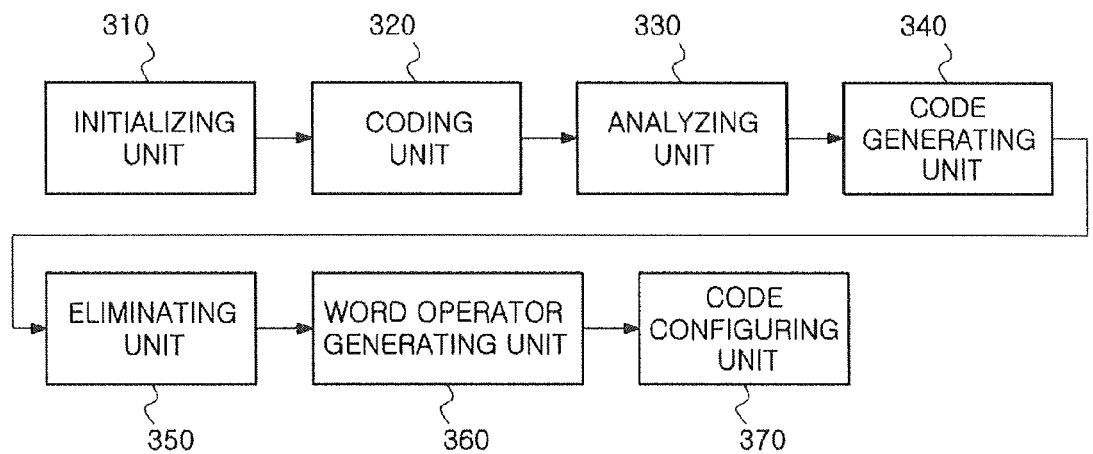
FIG. 3 is a block diagram for showing a quantum code designing apparatus according to an embodiment of the present disclosure in detail.

FIG. 2 is a flowchart for illustrating a quantum code designing method according to an embodiment of the present disclosure, and FIG. 3 is a block diagram for showing a quantum code designing apparatus according to an embodiment of the present disclosure in detail.

Referring to FIGS. 2 and 3, the quantum code designing apparatus according to an embodiment of the present disclosure may make the at least one quantum error into an initial state by applying the at least one entangled qubit to an initial state of qubit, by using an initializing unit 310.

For example, the initializing unit 310 according to an embodiment of the present disclosure may make an initial state as shown in Equation 1 by applying c number of entangled qubits to an initial state of n-qubit in order to correct an e number of quantum errors.

$$|S'\rangle_{EA} = |0\rangle \otimes^{(n-c)} |\Phi_+\rangle^{\otimes c} \quad \text{Equation 1}$$
$$\equiv |0\ldots0\rangle e_o \ldots e_o\rangle$$

At this time, $$|e_o\rangle = |\Phi_+\rangle = \frac{1}{\sqrt{2}}(|00\rangle + |11\rangle).$$

The quantum code designing apparatus according to an embodiment of the present disclosure may code may code the initial state by using a unitory coding operation which generates a stabilizer generator of a standard form of the CWS code, by using a coding unit 320.

The quantum code designing apparatus according to an embodiment of the present disclosure may analyze at least one quantum error generated at the quantum error channel as at least one binary error by using a standard form of the CWS code, by using an analyzing unit 330 (Step 210).

The analyzing unit 330 according to an embodiment of the present disclosure may convert the at least one quantum error into the at least one binary error according to Equation 2 below by using the stabilizer generator.

$$Cl_G(E = \pm Z^v X^u) = v \oplus \bigoplus_{l=1}^{n} u_l r_l \quad \text{Equation 2}$$

Here, E represents an error occurring at the channel, v and u represent binary vectors, $r_l$ represents a $l^{th}$ row of a binary matrix representing a circular graph which configures a stabilizer generator, and x and z represent Pauli operators.

The quantum code designing apparatus according to an embodiment of the present disclosure generates a binary error-correcting code which corrects the at least one binary error, by means of a code generating unit 340 (Step 220).

The quantum code designing apparatus according to an embodiment of the present disclosure generates at least one word operator of the CWS code, by means of the at least one binary error-correcting code (Step 230).

The quantum code designing apparatus according to an embodiment of the present disclosure may eliminate an entangled qubit performed at a receiving unit from the at least one word operator by applying the stabilizer generator to the at least one word operator, by means of an eliminating unit 350.

The quantum code designing apparatus according to an embodiment of the present disclosure may generate at least one codeword containing at least one entangled qubit (ebit) by using the at least one word operator, by means of a word operator generating unit 360 (Step 240).

The word operator generating unit 360 according to an embodiment of the present disclosure may generate a word operator for the initial state by applying a unitory coding operation to the word operator, from which an entangled qubit is removed, performed at the receiving unit.

The quantum code designing apparatus may configure a quantum error-correcting code by applying the generated word operator of the initial state to Equation 3 below, by means of a code configuring unit 370.

$$\omega'_l = X^{xl} \otimes Z^{vl} X^{ul} | I \otimes^c \quad \text{Equation 3}$$

Here, $w'_l$ represents a word operator of the CWS code.

Figure 4:
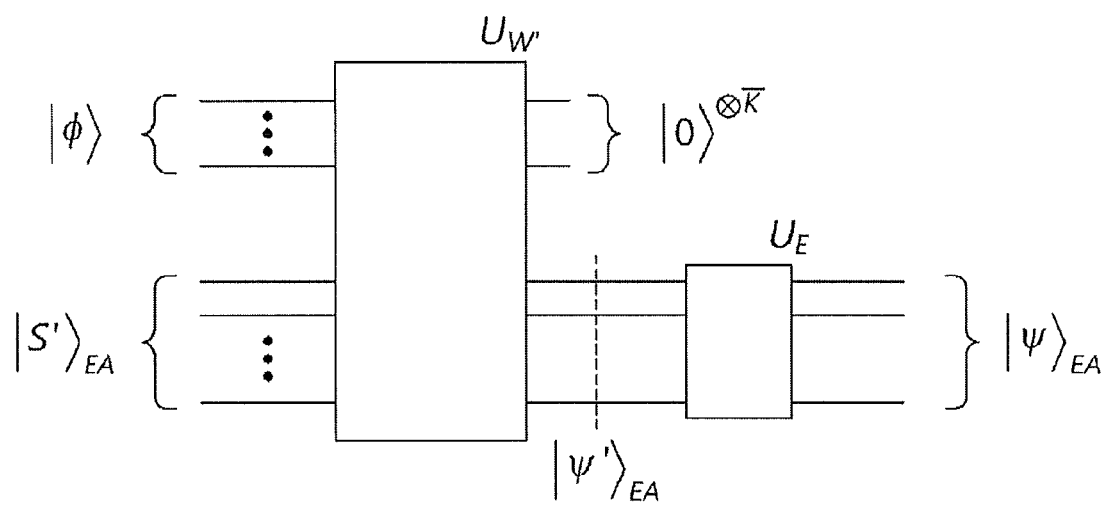
FIG. 4 is a diagram for illustrating a process of coding quantum information by using a code configuration according to an embodiment of the present disclosure.

FIG. 4 is a diagram for illustrating a process of coding quantum information by using a code configuration according to an embodiment of the present disclosure.

The code configuring unit 370 according to an embodiment of the present disclosure may code quantum information as shown in FIG. 4.

The embodiments of the present disclosure may be implemented as program commands executable by various kinds of computer means and recorded on a computer-readable recording medium. The computer-readable recording medium may include program commands, data files, data structures or the like solely or in combination. The program commands recorded on the medium may be specially designed or configured for the present disclosure or known to and available by computer software engineers. The computer-readable recording medium includes, for example, magnetic media such as a hard disk, a floppy disk and a magnetic tape, optical media such as CD-ROM and DVD, magneto-optical media such as a floptical disk, hardware devices such as ROM, RAM and a flash memory, specially configured to store and perform program commands, or the like. The program commands include not only machine codes made by a complier but also high-level language codes executable by a computer by using an interpreter. The hardware device may be configured to operate as at least one software module to perform the operations of the present disclosure, or vice versa.

While the exemplary embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

The invention claimed is:

1. An apparatus for designing a quantum code, comprising:
    an analyzing unit for converting at least one quantum error generated in a quantum error channel into at least one binary error by using a standard form codeword stabilized quantum (CWS) code;
    a code generating unit for generating a binary error-correcting code which corrects the at least one binary error;
    a word operator generating unit for generating at least one word operator of the CWS code by using the at least one binary error-correcting code; and
    a codeword generating unit for generating at least one codeword including at least one entangled qubit (ebit) by using the at least one word operator.

2. The apparatus for designing a quantum code according to claim 1,
    wherein a transmitting unit and a receiving unit share the at least one entangled qubit.

3. The apparatus for designing a quantum code according to claim 1,
    wherein the at least one word operator is generated independently in a transmitting unit.

4. The apparatus for designing a quantum code according to claim 1, further comprising:
    an initializing unit for making the at least one quantum error into an initial state by applying the at least one entangled qubit to an initial state of qubit.

5. The apparatus for designing a quantum code according to claim 4, further comprising:
    a coding unit for coding the initial state by using a unitory coding operation which generates a stabilizer generator of a standard form of the CWS code.

6. The apparatus for designing a quantum code according to claim 5,
    wherein the analyzing unit converts the at least one quantum error into the at least one binary error according to Equation 1 below by using the stabilizer generator:

$$Cl_G(E = \pm Z^v X^u) = v \oplus \bigoplus_{l=1}^{n} u_l r_1 \quad \text{Equation 1}$$

where E represents an error occurring at the channel, v and u represent binary vectors, $r_l$ represents a $l^{th}$ row of a binary matrix representing a circular graph which configures a stabilizer generator, and x and z represent Pauli operators.

7. The apparatus for designing a quantum code according to claim 5, further comprising:
    an eliminating unit for eliminating an entangled qubit performed at a receiving unit from the at least one word operator by applying the stabilizer generator to the at least one word operator.

8. The apparatus for designing a quantum code according to claim 7,
    wherein the word operator generating unit generates a word operator for the initial state by applying a unitory coding operation to the word operator, from which an entangled qubit is eliminated, performed at the receiving unit.

9. The apparatus for designing a quantum code according to claim 8, further comprising:
    a code configuring unit for configuring a quantum error-correcting code by applying the generated word operator of the initial state to Equation 2 below:

$$\omega'_l = X^{xl} \otimes Z^{vl} X^{ul} | I \otimes^c \quad \text{Equation 2}$$

where $w'_l$ represents a word operator of the CWS code.

10. A method for designing a quantum code, comprising:
    converting at least one quantum error generated in a quantum error channel into at least one binary error by using a standard form codeword stabilized quantum (CWS) code;

generating a binary error-correcting code which corrects the at least one binary error;

generating at least one word operator of the CWS code by using the at least one binary error-correcting code; and generating at least one codeword including at least one entangled qubit (ebit) by using the at least one word operator.

11. The method for designing a quantum code according to claim 10, wherein a transmitting unit and a receiving unit share the at least one entangled qubit.

12. The method for designing a quantum code according to claim 10, wherein the at least one word operator is generated independently in a transmitting unit.

13. The method for designing a quantum code according to claim 10, further comprising:

making the at least one quantum error into an initial state by applying the at least one entangled qubit to an initial state of qubit.

14. The method for designing a quantum code according to claim 13, further comprising:

coding the initial state by using a unitary coding operation which generates a stabilizer generator of a standard form of the CWS code.

15. The method for designing a quantum code according to claim 14, wherein the at least one quantum error is converted into the at least one binary error according to Equation 3 below by using the stabilizer generator:

$$Cl_G(E = \pm Z^v X^u) = v \oplus \bigoplus_{l=1}^{n} u_l r_l \quad \text{Equation 3}$$

where E represents an error occurring at the channel, v and u represent binary vectors, $r_l$ represents a $l^{th}$ row of a binary matrix representing a circular graph which configures a stabilizer generator, and x and z represent Pauli operators.

16. The method for designing a quantum code according to claim 14, further comprising:

eliminating an entangled qubit performed at a receiving unit from the at least one word operator by applying the stabilizer generator to the at least one word operator.

17. The method for designing a quantum code according to claim 16, wherein a word operator for the initial state is generated by applying a unitory coding operation to the word operator, from which an entangled qubit is eliminated, performed at the receiving unit.

18. The method for designing a quantum code according to claim 17, further comprising:

configuring a quantum error-correcting code by applying the generated word operator of the initial state to Equation 4 below:

$$\omega'_l = X^{xl} \otimes Z^{vl} X^{ul} | I^{\otimes c} \quad \text{Equation 4}$$

where $w'_l$ represents a word operator of the CWS code.

19. A non-transitory computer-readable recording medium, in which a program for performing the method according to claim 10 is recorded.

* * * * *